United States Patent
Kuwajima

(10) Patent No.: US 7,855,460 B2
(45) Date of Patent: Dec. 21, 2010

(54) ELECTRONIC COMPONENT TO PROTECT AN INTERFACE BETWEEN A CONDUCTOR AND AN INSULATOR AND METHOD FOR MANUFACTURING THE SAME

(75) Inventor: Hajime Kuwajima, Tokyo (JP)

(73) Assignee: TDK Corporation, Tokyo (JP)

( * ) Notice: Subject to any disclaimer, the term of this patent is extended or adjusted under 35 U.S.C. 154(b) by 202 days.

(21) Appl. No.: 12/100,039

(22) Filed: Apr. 9, 2008

(65) Prior Publication Data
US 2008/0265429 A1  Oct. 30, 2008

(30) Foreign Application Priority Data
Apr. 25, 2007  (JP) ............... 2007-115881

(51) Int. Cl.
*H01L 23/48* (2006.01)
(52) U.S. Cl. ............... 257/773; 257/736; 257/E23.141; 438/461
(58) Field of Classification Search ............ None
See application file for complete search history.

(56) References Cited

U.S. PATENT DOCUMENTS

| | | | | |
|---|---|---|---|---|
| 4,801,489 A | * | 1/1989 | Nakagawa et al. | 428/209 |
| 5,270,493 A | * | 12/1993 | Inoue et al. | 174/253 |
| 6,376,912 B1 | * | 4/2002 | Seto | 257/760 |
| 6,392,297 B2 | * | 5/2002 | Seto | 257/701 |
| 7,385,293 B2 | * | 6/2008 | Mizuno et al. | 257/762 |
| 2006/0068587 A1 | | 3/2006 | Mizuno et al. | |
| 2007/0205514 A1 | * | 9/2007 | Togashi | 257/758 |
| 2007/0228512 A1 | * | 10/2007 | Kuwajima et al. | 257/528 |
| 2008/0236873 A1 | * | 10/2008 | Kuwajima | 174/257 |

FOREIGN PATENT DOCUMENTS

| | | | |
|---|---|---|---|
| JP | 9-270325 | | 10/1997 |
| JP | 9-270342 | | 10/1997 |
| JP | 11-154612 | | 6/1999 |
| JP | 11-154612 A | * | 6/1999 |
| JP | 11-191646 | | 7/1999 |
| JP | 2001-43514 | | 2/2001 |
| JP | 2003-338429 | | 11/2003 |

* cited by examiner

*Primary Examiner*—Thanh V Pham
*Assistant Examiner*—Andres Munoz
(74) *Attorney, Agent, or Firm*—Oblon, Spivak, McClelland, Maier & Neustadt, L.L.P.

(57) ABSTRACT

An electronic component is provided with a first conductor, an insulator for covering a surface of the first conductor, a via hole penetrating the insulator, and a second conductor located on a surface of the insulator and electrically connected to the first conductor through the via hole, and includes a shielding film having conductivity, being interposed between the first conductor and the second conductor, and covering an interface between the first conductor and the insulator in the via hole by extending continuously at least from the surface of the first conductor constituting a bottom surface of the via hole to an inner wall surface of the via hole.

4 Claims, 6 Drawing Sheets

ELECTRONIC COMPONENT TO PROTECT AN INTERFACE BETWEEN A CONDUCTOR AND AN INSULATOR AND METHOD FOR MANUFACTURING THE SAME

CROSS-REFERENCE TO RELATED APPLICATIONS

The present invention is related to U.S. patent application Ser. No. 12/029,756 entitled "ELECTRONIC COMPONENT AND METHOD FOR MANUFACTURING THE SAME" filed on Feb. 12, 2008 (claiming the Convention Priority based on Japanese patent application 2007-89899 filed on Mar. 29, 2007). The disclosure of the above U.S. application is herein incorporated by reference.

BACKGROUND OF THE INVENTION

The present invention relates to an electronic component and a method for manufacturing the same. More specifically, the present invention relates to a technique for improving reliability of an electronic component, which is formed by laminating a conducting film and an insulating film, by enhancing resistance of an interlayer connector.

Today, there are offered various discrete components such as chip capacitors, chip inductors or chip resistors and various chip electronic components such as electronic devices each including a combination of multiple active elements and passive elements (hereinafter also simply referred to as chips). These electronic components generally include laminated structures formed by stacking conducting films made of conductive materials and insulating films made of insulative materials. A chip includes various functional element units corresponding to the type of the chip, such as capacitor electrodes, inductor conductors, resistor conductors and impedance matching lines.

Moreover, numerous electric connectors are provided inside a chip in order to construct these functional element units or to electrically connect the functional element units to one another. For example, a via hole penetrating an insulating film is used for connecting conductors that are laminated, as described above, with the insulating film interposed therebetween. In addition, terminal electrodes are provided on an outer surface (such as a side surface, a bottom surface or a top surface) of the chip to achieve electrical and mechanical connection to the outside (such as a mounting board), and these terminal electrodes are also connected to the functional element units.

Further, a protective film is provided on the outer surface of the chip in order to: prevent short circuits, disconnection, degradation, and corrosion inside the chip; and protect the chip from various treatment liquids used in a manufacturing process or physical external forces, damages, moisture, and the like applied after the chip is mounted as a product.

Additionally, examples of the electronic components are disclosed in: Japanese Patent Application Publications Nos. Hei 9-270342, Hei 11-154612 and Hei 9-270325 (see FIG. 7, Paragraphs 0045 and 0049) (hereinafter referred to as Patent Documents 1, 2 and 3, respectively).

SUMMARY OF THE INVENTION

Failures of connectors between conductors inside chips are sometimes found in conventional electronic components. In this context, there is still room for further improvement in light of enhancing reliability of electronic components.

To be more precise, when a chip is observed after pre- and post-processing for forming a foundation layer of terminal electrodes, for example, after chemical cleaning such as a degreasing treatment, it is sometimes found that electrodes inside the chip are eroded or corroded because the protective film is detached, or that residues exist on interfaces between the protective film and the electrodes. Such phenomena are similarly found: after pretreatment cleaning for barrel plating or chemical plating is performed to form a body layer or a surface layer of the terminal electrodes; or after flux cleaning is performed to solder finished chips. After these electronic components are mounted on various devices and used for years as products, the above-mentioned detachment, erosion, corrosion, residues, or the like may degrade characteristics of the devices, and act as a cause of lowered durability.

Moreover, quality degradation such as IR (interconnection resistance) degradation or capacitor open/short defects is also sometimes found in tests of reliability evaluation including a high humidity exposure test, a high humidity load test, a water absorption reflow test, and the like. Fluctuation is also found in threshold limit values in withstand voltage tests.

In addition to the degradation attributable to the above-described chemical loads, defects attributable to physical and mechanical loads can occur in a chip processing step. To be more specific, from the viewpoint of mass productivity, the above-mentioned electronic components are usually manufactured by: depositing and laminating films on a single base material (having numerous chips aggregated therein) to collectively form internal conductors (functional element units); and then cutting and dividing the base material into individual chips. In the processing step of dividing the collectively formed internal conductors into the individual chips, cutting burr may be generated or interface detachment due to damages on the films may be caused. Meanwhile, the films per se contain residual stresses generated when the films are deposited and laminated. Although being suppressed when the chips are aggregated (the films are continuous on the whole base material), the residual stresses are released at the time of division into the individual chips. Such release of the stress may also lead to detachment of the films inside each of the chips.

The electronic component disclosed in Patent Document 1 is not capable of protecting a connector between conductors as well as an interface portion between the conductor and a protective film or an insulating film. Similarly, the electronic component disclosed in Patent Document 2 is merely provided with a thick outermost layer, and is not capable of particularly protecting an interface between an insulating film and a conductor. Further, Patent Document 3 discloses a structure configured to electrically connect an internal conductor covered with an insulating layer to an external connector terminal. However, this structure includes an electrode extracting unit 16 formed as a through hole and an extraction electrode 17 made of a conductor filled in this through hole, and the extraction electrode 17 is provided to simply cover an insulative resin layer 12. Accordingly, this structure cannot shield treatment liquids or moisture sufficiently.

Therefore, it is an object of the present invention to further improve reliability of an electronic component formed by laminating conducting films and an insulating film, by means of enhancing resistance of a connector between conductors of the electronic component, or more specifically by means of enhancing resistance of a via hole.

To solve the problems and to attain the object, a first electronic component according to the present invention is an electronic component provided with a first conductor made of a conductive material, an insulator made of an insulative material and configured to cover a surface of the first conductor, a via hole penetrating the insulator, and a second conductor made of a conductive material, located on a surface of the insulator, and electrically connected to the first conductor through the via hole. Here, the electronic component includes a shielding film having conductivity, being interposed between the first conductor and the second conductor, and covering an interface between the first conductor and the insulator in the via hole by extending continuously at least from the surface of the first conductor constituting a bottom surface of the via hole to an inner wall surface of the via hole.

In the first electronic component of the present invention, the shielding film covers the interface between the first conductor and the insulator disposed on the surface thereof inside the via hole. Accordingly, it is possible to protect the interface from infiltration of various chemical solutions (including surfactant treatment fluids such as a degreasing fluid, etching fluids, and plating fluids, for example), entry of moisture, and so forth.

The shielding film is formed so as to extend continuously at least from the surface of the first conductor constituting the bottom surface of the via hole to the inner wall surface of the via hole (the insulator). In addition, it is possible to allow the shielding film to continuously cover an upper surface of the insulator (surrounding part of an upper end aperture of the via hole). The shielding film has conductivity. Therefore, it is possible to ensure electrical connection between the first conductor and the second conductor if the above-described continuous coating is formed inside the via hole.

Here, regarding the first conductor and the second conductor, the first conductor is typically an internal conductor located inside the electronic component while the second conductor is typically a surface conductor located on an outer surface (such as a side surface, a top surface or a bottom surface) of the electronic component. However, the configuration of the electronic component is not limited only to the foregoing. For example, the first conductor may be a conductor located on one surface of a substrate while the second conductor may be a conductor located on the other surface of the substrate. Alternatively, both of the first conductor and the second conductor may be internal conductors (such as in the case where a protective film having only a physically protective function is provided on a surface of the second conductor, so that an interface between the first conductor and the insulator provided on the surface thereof is susceptible to damages by chemical solutions or gases). After all, the first conductor and the second conductor are the conductors respectively provided on both surfaces of the insulator so as to interpose the insulator therebetween. Moreover, the first conductor and the second conductor may be various types and functions of conductors including terminal electrodes (external connection terminals) or part of such electrodes, wiring, inductor conductors, capacitor electrodes, impedance wiring, phase adjusting lines, resistor conductors, and the like.

Moreover, the second conductor may be formed as a surface conductor (a side surface conductor) provided on a side surface of the electronic component, and the shielding film may be formed so as to further cover a range from the inside of the via hole to the side surface of the electronic component continuously. According to this structure, the side surface conductor (such as a side surface terminal electrode) can be formed by electrolytic plating while using the shielding film as a foundation electrode (a conducting layer). Hence, it is possible to omit an independent step of forming the foundation layer for the side surface conductor.

The shielding film is preferably made of a material having chemical resistance, in particular resistance to at least any of a surfactant treatment fluid, a degreasing fluid, an acidic chemical solution, an alkaline chemical solution, a solvent (such as a developing agent for photosensitive resin), alcohol, a plating fluid and an etching fluid. Moreover, the shielding film is preferably made of the material having moisture resistance, gas permeation resistance, and corrosion resistance at the same time. Particularly, the shielding film of the present invention needs to be made of the material having resistance to various chemicals and solvents used in the processes after the interface is formed between the conductors and the insulators.

To be more precise, the above-described shielding film may be formed as a film containing any of, for example, Cr, Ni, Ti, Cu, W, Ag, and Al as a main component. Since these materials have conductivity, it is possible to establish electrical connection to the counterpart conductor even when the entire surface of the conductor to be connected including the interface (a boundary) between the conductor and the insulator is covered with the shielding film.

The shielding film is preferably formed by a vapor growth method. For example, when the shielding film is formed as a thin film by sputtering, it is possible to enhance bond strength of the shielding film and thereby to obtain an excellent shielding property. In addition to the sputtering method, it is also possible to form the shielding film by other vapor growth methods (such as an evaporation method or a CVD (chemical vapor deposition) method), electroless plating methods, and so forth. Meanwhile, the shielding film is preferably made of a dense film in light of enhancing adhesion and a tracking property to level differences. To be more specific, the shielding film may be formed of the film containing conductive particulates having grain diameters equal to or below $1.0\,\mu m$, preferably equal to or below $0.5\,\mu m$, and more preferably equal to or below $0.1\,\mu m$.

Meanwhile, in addition to the insulating film for establishing electrical insulation between the respective conductors provided in the electronic component, the "insulator" in the present invention broadly includes various insulating films that contact the respective conductors (the first conductor, the second conductor, and connecting conductors), such as a dielectric film provided for forming a capacitor, a magnetic film provided for forming an inductor, a protective layer formed on an outermost layer of a chip in order to protect the electronic component, a planarizing film formed for planarizing a surface or a substrate.

A second electronic component according to the present invention is an electronic component provided with a first conductor made of a conductive material, an insulator made of an insulative material and configured to cover a surface of the first conductor, a second conductor made of a conductive material and located on a surface of the insulator, a via hole penetrating the insulator, and a connecting conductor located inside the via hole and configured to electrically connect the first conductor to the second conductor. Here, the electronic component includes a shielding film having conductivity, being interposed between the first conductor and the connecting conductor, and covering an interface between the first conductor and the insulator in the via hole by extending continuously at least from the surface of the first conductor constituting a bottom surface of the via hole to an inner wall surface of the via hole.

A third electronic component according to the present invention is an electronic component provided with a first conductor made of a conductive material, an insulator made of an insulative material and configured to cover a surface of the first conductor, a via hole penetrating the insulator, a second conductor made of a conductive material and located on a surface of the insulator, and a connecting conductor located so as to be filled in the via hole and to electrically connect the first conductor to the second conductor. Here, the electronic component includes a shielding film having conductivity, being interposed between the second conductor and the connecting conductor, and being configured to cover an interface between the connecting conductor and the insulator by extending from a surface of the connecting conductor to the surface of the insulator around the via hole.

These second and third electronic components have the structures that are suitably applicable to a filled via configured to fill the inside of the via hole penetrating the insulator with a conductive material such as plated metal or conductive resin. The shielding film is provided so as to be interposed between the first conductor and the connecting conductor located inside the via hole and the first conductor to electrically connect the first conductor to the second conductor, and is configured to cover the surface of the first conductor at the bottom surface of the via hole and the inner wall surface of the via hole. Alternatively, the shielding film is provided so as to be interposed between the connecting conductor and the second conductor, and is configured to cover the surface (an upper surface) of the connecting conductor and surrounding part thereof (the surface of the insulator). In this way, it is possible to protect the interface between the first conductor and the insulator or the interface between the connecting conductor and the insulator. Here, concrete configurations (such as materials) concerning the shielding films and the insulators are similar to those used in the first electronic component (the same applies to a fourth electronic component described below).

Meanwhile, a fourth electronic component according to the present invention is an electronic component provided with a first conductor made of a conductive material, an insulator made of an insulative material and configured to cover a surface of the first conductor, a second conductor made of a conductive material and located on a surface of the insulator, a via hole penetrating the insulator, and a filler to be filled in the via hole so as to bury a space inside the via hole. Here, the electronic component includes a shielding film having conductivity, being interposed between the first conductor and the filler, and covering an interface between the first conductor and the insulator in the via hole by extending continuously at least from the surface of the first conductor constituting a bottom surface of the via hole to an inner wall surface of the via hole and further to the surface of the insulator around the via hole.

In this fourth electronic component, the filler is provided inside the via hole instead of providing the connecting conductor. By providing the filler as described above, even if a space is formed inside the via hole (or if a dent is formed on an upper surface of the via hole) after formation of the shielding film, it is still possible to bury the space and to planarize the upper surface of the via hole. Accordingly, it is possible to achieve film deposition (formation of the second conductor and other films thereon when applicable) favorably thereafter (the same applies to the second and third electronic component provided with the connecting conductors). In this fourth electronic component, the filler may be made of a material having no conductivity (or having low conductivity), because electrical connection between the first conductor and the second conductor can be achieved through the shielding film by forming the shielding film having the conductivity so as to reach the surface of the insulator around the via hole.

According to the electronic components of the present invention, the interface (the boundary) between the conductor and the insulator inside the via hole for connecting the conductors to each other is covered with the shielding films as described above. Therefore, it is possible to block infiltration of various chemical solutions used in the chip manufacturing process into spaces between the conductors and the insulators, and to prevent entry of moisture and the like after the chips are mounted as products. Meanwhile, even when an external force is applied to the base material in an aggregate state containing the chips at the time of processing or an external force is applied to the chip formed into an individual product, or when stress is applied to the interface between the conductor and the insulator due to internal residual stress, the shielding film suppresses detachment of the films by bearing such loads, thereby protecting the interface between the conductor and the insulator.

Further, in the electronic component according to the present invention, the via hole may be formed so as to set a ratio h/d between a depth h and a diameter d thereof within a range from 1 to 5 when appropriate. According to the present invention, the shielding film having conductivity is formed in the via hole and this shielding film can be formed by a vapor growth method such as the sputtering method or the CVD method. Therefore, it is possible to increase an aspect ratio h/d of the via hole (the ratio between the depth h and the diameter d of the via hole) significantly greater than a conventional via hole structure configured to establish interlayer connection by filling conductive paste into a through hole. To be more precise, the ratio h/d is limited to a range from about 0.2 to 2 in the related art. On the contrary, according to the present invention, it is possible to increase the ratio in the range from about 1 to 5 as described above. Therefore, the present invention also has an advantage that it is possible to reduce spaces occupied by via holes and thereby to contribute to downsizing and high-density packaging of electronic components.

Meanwhile, a first method for manufacturing an electronic component according to the present invention is a method for manufacturing an electronic component having a first conductor forming step of forming a first conductor made of a conductive material, an insulator forming step of forming an insulator made of an insulative material, configured to cover a surface of the first conductor, and provided with a via hole, and a second conductor forming step of forming a second conductor made of a conductive material, located on a surface of the insulator, and electrically connected to the first conductor through the via hole. The method is carried out such that at least the first conductor forming step and the insulator forming step are executed with a plurality of electronic components aggregated in a single base material so as to provide the respective electronic components with the first conductors, the insulators, and the via holes, and that the base material is then cut into chips to obtain the individual electronic components. Here, the method includes a shield film forming step of providing a shielding film for each of the electronic components aggregated in the base material after the insulator forming step and before the second conductor forming step, the shielding film having conductivity, being interposed between the first conductor and the second conductor, and covering an interface between the first conductor and the insulator in the via hole by extending continuously at least from the surface of the first conductor constituting a bottom surface of the via hole to an inner wall surface of the via hole.

A second method for manufacturing an electronic component according to the present invention is a method for manufacturing an electronic component having a first conductor forming step of forming a first conductor made of a conductive material, an insulator forming step of forming an insulator made of an insulative material, configured to cover a surface of the first conductor, and provided with a via hole, a connecting conductor forming step of locating a connecting conductor made of a conductive material inside the via hole, and a second conductor forming step of forming a second conductor made of a conductive material, located on a surface of the insulator, and electrically connected to the first conductor through the connecting conductor. The method is carried out such that at least the first conductor forming step, the insulator forming step, and the connecting conductor forming step are executed with a plurality of electronic components aggregated in a single base material so as to provide the respective electronic components with the first conductors, the insulators, the via holes, and the connective conductors, and that the base material is then cut into chips to obtain the individual electronic components. Here, the method includes a shield film forming step of providing a shielding film for each of the electronic components aggregated in the base material after the insulator forming step and before the connecting conductor forming step, the shielding film having conductivity, being interposed between the first conductor and the connecting conductor, and covering an interface between the first conductor and the insulator in the via hole by extending continuously at least from the surface of the first conductor constituting a bottom surface of the via hole to an inner wall surface of the via hole.

A third method for manufacturing an electronic component according to the present invention is a method for manufacturing an electronic component having a first conductor forming step of forming a first conductor made of a conductive material, an insulator forming step of forming an insulator made of an insulative material, configured to cover a surface of the first conductor, and provided with a via hole, a connecting conductor forming step of locating a connecting conductor made of a conductive material inside the via hole, and a second conductor forming step of forming a second conductor made of a conductive material, located on a surface of the insulator, and electrically connected to the first conductor through the connecting conductor. The method is carried out such that at least the first conductor forming step, the insulator forming step, and the connecting conductor forming step are executed with a plurality of electronic components aggregated in a single base material so as to provide the respective electronic components with the first conductors, the insulators, the via holes, and the connective conductors, and that the base material is then cut into chips to obtain the individual electronic components. Here, the method includes a shield film forming step of providing a shielding film for each of the electronic components aggregated in the base material after the connecting conductor forming step and before the second conductor forming step, the shielding film having conductivity, being interposed between the second conductor and the connecting conductor, and covering an interface between the connecting conductor and the insulator by extending continuously from a surface of the connecting conductor to the surface of the insulator around the via hole.

Moreover, a fourth method for manufacturing an electronic component according to the present invention is a method for manufacturing an electronic component having a first conductor forming step of forming a first conductor made of a conductive material, an insulator forming step of forming an insulator made of an insulative material, configured to cover a surface of the first conductor, and provided with a via hole, a via filling step of filling the via hole with a filler for burying a space inside the via hole, and a second conductor forming step of forming a second conductor made of a conductive material, located on a surface of the insulator, and electrically connected to the first conductor through the connecting conductor. The method is carried out such that at least the first conductor forming step, the insulator forming step, and the via filling step are executed with a plurality of electronic components aggregated in a single base material so as to provide the respective electronic components with the first conductors, the insulators, the via holes, and the fillers, and that the base material is then cut into chips to obtain the individual electronic components. Here, the method includes a shield film forming step of providing a shielding film for each of the electronic components aggregated in the base material after the insulator forming step and before the via filling step, the shielding film having conductivity, being interposed between the first conductor and the filler, and covering an interface between the first conductor and the insulator in the via hole by extending continuously at least from the surface of the first conductor constituting a bottom surface of the via hole to an inner wall surface of the via hole and further to the surface of the insulator around the via hole.

According to the above-described manufacturing methods, it is possible to efficiently manufacture highly reliable chips including the via holes having excellent resistance by forming the shielding films simultaneously on the a plurality of chips.

Moreover, in each of the above-described manufacturing methods, it is preferable to planarize an upper surface of the via hole (make an upper surface of the via hole flat) by providing any of the connecting conductor and the filler, or to planarize the upper surface of the via hole by polishing an upper surface of any of the connecting conductor and the filler after providing any of the connecting conductor and the filler inside the via hole. Such a process is carried out in order to enhance adhesion between the connecting conductor and the second conductor, or to favorably form various films provided on the via hole (the second conductor and other conducting films and insulating films to be further provided thereon as appropriate), the via hole, or the like.

The second conductor may take the form of a terminal electrode for external connection, wiring to be provided on an outer surface of the electronic component, and various other conductors. In this case, the second conductor may be formed before cutting the base material into the chips, or formed after cutting the base material into the chips (including the case where a supporting member on a back surface of the base material is provided so as to maintain the individual chips in an arranged state without being scattered, even when the base material is cut (cut grooves are formed), for example).

According to the present invention, it is possible to enhance resistance of a connection between a first conductor (such as an internal conductor) and a second conductor (such as a terminal electrode) and thereby to further improve reliability of an electronic component.

Other objects, features and advantages of the invention will become apparent from the following description of the embodiments of the invention taken in conjunction with the accompanying drawings. In the drawings, similar reference characters denote similar elements throughout the several views.

DESCRIPTION OF THE EMBODIMENTS

First Embodiment

Figure 1:
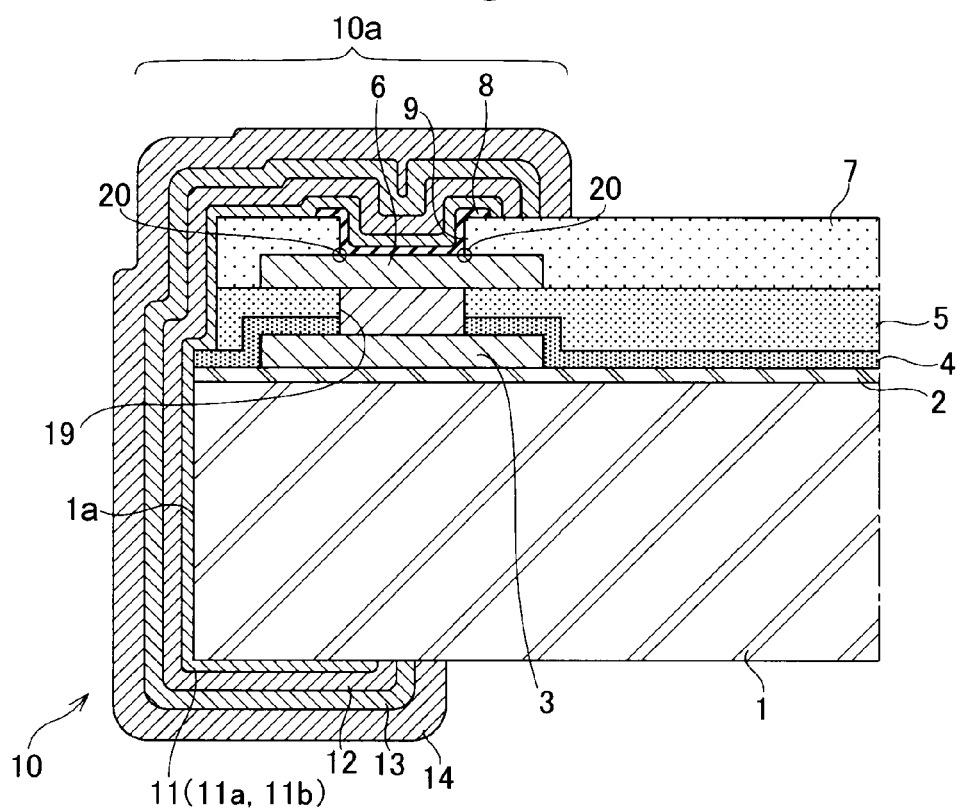
FIG. 1 is a cross-sectional view schematically showing an electronic component according to a first embodiment of the present invention.

FIG. 1 is a cross-sectional view schematically showing an electronic component according to a first embodiment of the present invention. As shown in the drawing, an electronic component (a chip) of this embodiment includes a base substrate 1 constituting a core provided with: a planarization film 2, multiple conducting films 3 and 6 (internal conductors/wiring layers) laminated thereon; and an insulating film 5 (inclusive of a dielectric film 4/insulating layers) interposed between the conducting films for mutually insulating these conducting films, and a side surface terminal (a second conductor) 10 formed on a side surface 1a of the base substrate for serving as a terminal electrode for establishing external connection. Moreover, a protective film 7 is formed on an outermost layer of the chip.

Note that FIG. 1 shows a structure to electrically connect the two conducting films (a lower conductor 3 constituting an internal conductor and an upper conductor (a first conductor) 6 similarly constituting another internal conductor) to each other, and also to electrically connect these conducting films 3 and 6 to the side surface terminal (the second conductor) 10 through via holes 9 and 19. Moreover, with regard to the conducting films 3 and 6 illustrated in FIG. 1, the lower conductor 3 located on a lower side and the upper conductor 6 located on an upper side constitute separate internal conductors belonging to different wiring layers laminated vertically in the chip, with the insulating film 5 interposed therebetween. Here, only a connector of both of the conductors is shown in the drawing.

Moreover, in the case of this example, these internal conductors 3 and 6 are connected to each other through the via hole 19 that penetrates the insulating film 5 and the dielectric film 4, and these conductors are connected to the side surface terminal 10 through the via hole 9 that penetrates the protective film 7. Instead, it is possible to connect only one of the internal conductors (such as only the upper conductor 6 or only the lower conductor 3) to the side surface terminal 10. Alternatively, it is possible to provide three or more internal conductors (meaning a structure to connect more internal conductors thereto, i.e. a structure to connect respective internal conductors on three or more wiring layers to another). Meanwhile, a surface conductor to be connected to the internal conductors is not limited only to the side surface terminal. Such surface conductors may be terminal electrodes for external connection provided on a top surface or a bottom surface of the chip (such as bottom surface terminals for a LGA (Land Grid Array) or a BGA (Ball Grid Array)), connecting pads for various wire bonding techniques (such as wire bonding or flip-chip bonding associated with one or more operations of ultrasonic oscillation, heating, and pressurization), other electrodes not provided for external connection or other internal conductors covered with insulators.

In this embodiment, the lower conductor 3 is formed on a surface of the base substrate 1 that is smoothed by use of the planarization film 2, and the dielectric film 4 and the insulating film 5 including the via hole 19 are formed thereon. Then, the conductor is located inside the via hole 19 and the upper conductor 6 to be electrically connected to this conductor is provided on a surface of the insulating film 5. After forming the upper conductor 6, the protective film 7 including the via hole 9 is formed thereon.

Here, the respective via holes 9 and 19 can be formed by coating a photosensitive resin (or a thermosetting resin or an ultraviolet curing resin) constituting the insulating film and the protective film, and then subjecting the resin to pattern exposure and a development process (photolithography), for example. Alternatively, it is possible to form the via holes 9 and 19 by irradiating a laser beam after depositing the insulating film and the protective film, or by means of a mechanical process (drilling).

For example, the planarization film 2 can be formed by use of $Al_2O_3$, and the lower conductor 3 as well as the upper conductor 6 can be formed by depositing a Ti film and a Cu film sequentially by means of sputtering and then precipitating the Cu film thereon by electrolytic plating while using these films as foundation films. Meanwhile, the conductors to be located inside the via hole 19 can be formed by filling conductive resin into the via hole 19 or by precipitating plating metal by using the lower conductor 3 as a conducting body (or after forming the conducting film on an inner wall surface of the via hole 19 by electroless plating), for example.

The dielectric film 4, the insulating film 5, and the protective film 7 can be formed by use of resin (such as polyimide, epoxy resin, benzocyclobutene (BCB) or fluororesin) or inorganic materials (such as SiN, $SiO_2$, $Al_2O_3$ or TaO), for example. Here, it is also possible to provide only one of the dielectric film 4 and the insulating film 5 on the lower conductor 3 or the upper conductor 6. On the contrary, it is also possible to laminate multiple insulating films or multiple dielectric films (the same applies to other embodiments to be described later).

After forming the protective film 7, a shielding film 8 is provided in the via hole 9 that penetrates the protective film 7. This shielding film 8 is formed as the film that covers a surface of the upper conductor 6 constituting a bottom surface of the via hole 9, an inner peripheral surface of the protective film 7 constituting in inner wall surface of the via hole 9, and a surface of the protective film 7 around an upper end aperture of the via hole 9, in order to protect an interface 20 between the upper conductor 6 and the protective film 7. Moreover, this shielding film 8 is formed as a conducting film having excellent chemical resistance and achieving adhesion to the upper conductor 6 and the protective layer 7, such as a sputtered film made of a material selected from Cr, Ni, Ti, Ni—Cr alloys, Cu, Ag, Al, and W, for example. Here, it is also possible to form the shielding film 8 by laminating multiple layers (such as two layers, three layers, or four or more layers) using these metal materials. For example, it is possible to form the shielding film 8 by sequentially laminating a Cr sputtered film, a Cu sputtered film, and Cu plated film. Likewise, the shielding film 8 can be formed by using various other materials and in various numbers of laminated layers.

In addition, this shielding film 8 is preferably formed into a dense conducting film that contains small grain (grain diameter, for example, is equal to or below 1.0 µm, preferably equal to or below 0.5 µm, or more preferably equal to or below 0.1 µm) by reducing a deposition rate in the sputtering process, for example, in order to achieve a shielding performance, adhesion, and a tracking performance to steps of the shielding film 8 favorably. Instead of sputtering, it is also possible to form the shielding film by a vapor growth method such as an evaporation method or a CVD method, or by electroless plating.

After forming the shielding film 8, the side surface electrode 10 is formed so as to be electrically connected to the upper conductor 6 through the via hole 9. Here, in this embodiment, the conductors 3 and 6, the films 4, 5, 7, and 8, and the via holes 9 and 19 are formed simultaneously on a plurality of chips in an aggregate state containing the plurality of chips on a single base material (the base substrate) until formation of the shielding films 8. Thereafter, the base material is cut into the individual chips and the side surface electrodes 10 are formed on the individual chips. Note that an end surface of the base substrate 1 indicated with reference numeral 1a is the sectioned surface, and the side surface electrode 10 is formed continuously over this sectioned surface (the side surface of the base substrate (the chip)), a top surface of the chip, and a bottom surface of the chip into a U shape in this embodiment.

This side surface electrode 10 can be formed by preparing a Cr film 11a and a Cu film 11b sequentially deposited by sputtering collectively as a foundation layer 11, then forming a Cu film 12 constituting a body layer of the electrode 10 thereon by barrel plating, and then forming a Ni film 13 serving as a barrier layer and a Sn film 14 for enhancing solder wettability sequentially thereon.

Figure 2:
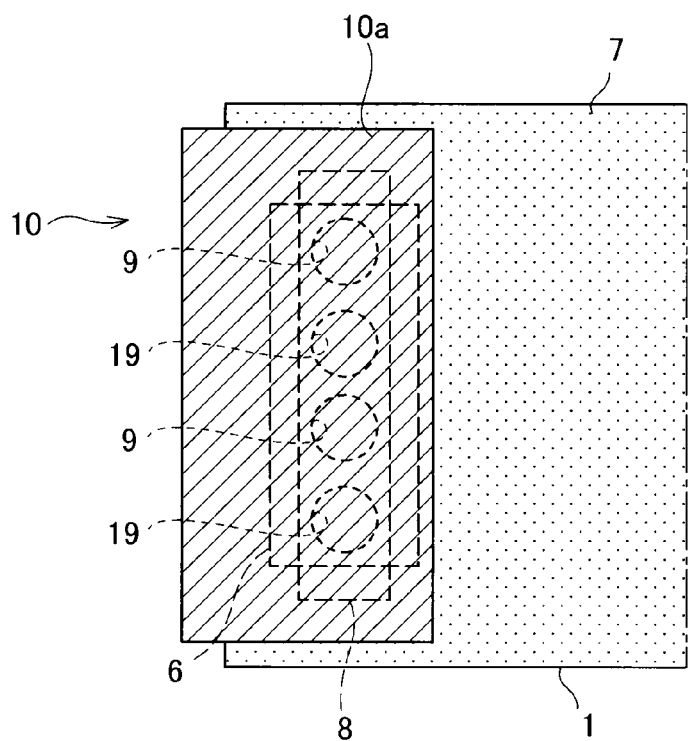
FIG. 2 is a plan view schematically showing the electronic component according to the first embodiment.

Connection between the side surface electrode 10 and the upper conductor 6 is achieved by forming a top surface portion 10a of the side surface electrode, which is supposed to be disposed on the top surface of the chip, so as to extend to the bottom surface of the via hole 9 that penetrates the protective film 7. In this way, it is possible to electrically connect the upper conductor 6 to the side surface electrode 10 through the shielding film 8. FIG. 2 is a plan view showing an upper surface side of the chip of this embodiment. As shown in the drawing, multiple pieces (two pieces in this embodiment) of the via holes 9 penetrating the protective film 7 for connecting the top surface portion 10a of the side surface electrode 10 and the upper conductor 6 are provided in this embodiment. The shielding film 8 is formed continuously (as a single film) over bottom surfaces and the inner wall surfaces of the respective via holes 9 and the surface of the protective film 7 around the via holes. Meanwhile, the via holes 19 for connecting the upper conductor 6 to the lower conductor 3 are formed in positions shifted from the via holes 9 when viewed from the top surface as shown in FIG. 2. Although the upper via holes 9 and the lower via holes 19 are alternately arranged in this embodiment as shown in the drawing, it is also possible to form the via holes 9 immediately above the lower via holes 19 in an overlapping manner (to apply a so-called via-on-via (stacked via) structure).

Figure 3:
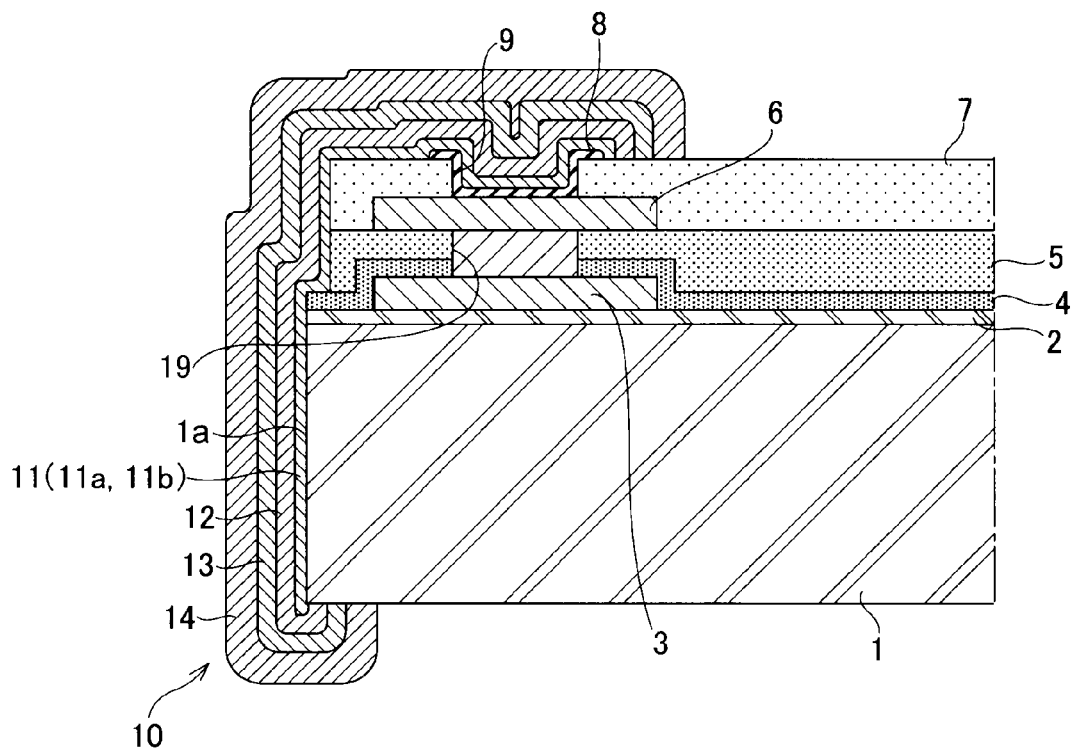
FIG. 3 is a cross-sectional view schematically showing a modified example of the electronic component according to the first embodiment.
Figure 4:
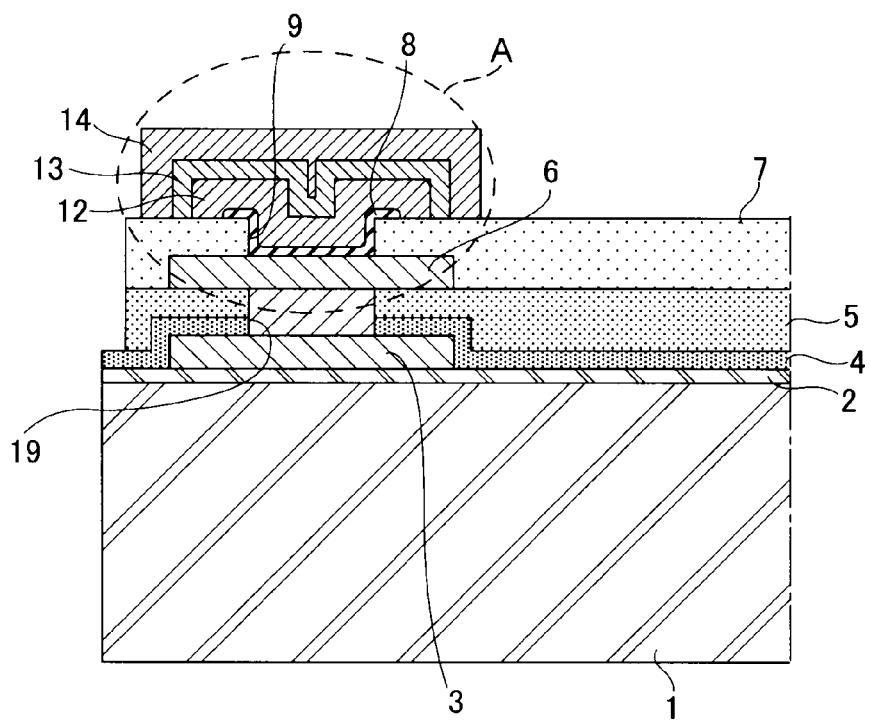
FIG. 4 is a cross-sectional view schematically showing another modified example of the electronic component according to the first embodiment.

In addition to the above-described shape, the side surface electrode 10 may be formed into an L shape as shown in FIG. 3, which extends from the side surface of the chip to the top surface (or the bottom surface) thereof. Alternatively, as shown in FIG. 4, the side surface electrode may be formed into a plate shape provided on either the top surface or the bottom surface of the chip. In the example shown in FIG. 4, it is possible to use the shielding film 8 as the foundation film used for forming the electrode body layer 12. Accordingly, it is possible to omit the foundation layer 11 for forming the electrode body layer 12 as shown in the example illustrated in FIG. 1 to FIG. 3.

The protective film 7 has been often provided as the outermost layer of a chip in the related art as similar to this embodiment. Nevertheless, though the protective film of this type which has heretofore been provided can protect the electrodes such as wiring in a chip or functional films thereof physically or mechanically, the protective film cannot completely protect an interface between an internal conductor and an insulating film such as a protective film from moisture or various treatment fluids. Therefore, conventional countermeasures have been limited only to lamination of multiple protective layers or molding a contour with resin. Such countermeasures lead to increases external sizes and thicknesses of products and increases in manufacturing costs of electronic components. On the contrary, according to this embodiment, the interface between the internal conductor and the insulating film is covered with the shielding film. Therefore, at the time when forming the side surface electrode, mounting the chip, or using the product, it is possible to more securely prevent troubles such as infiltration of a treatment fluid or entry of moisture through the interface, which may cause corrosion and deterioration of the internal conductor.

Figure 5:
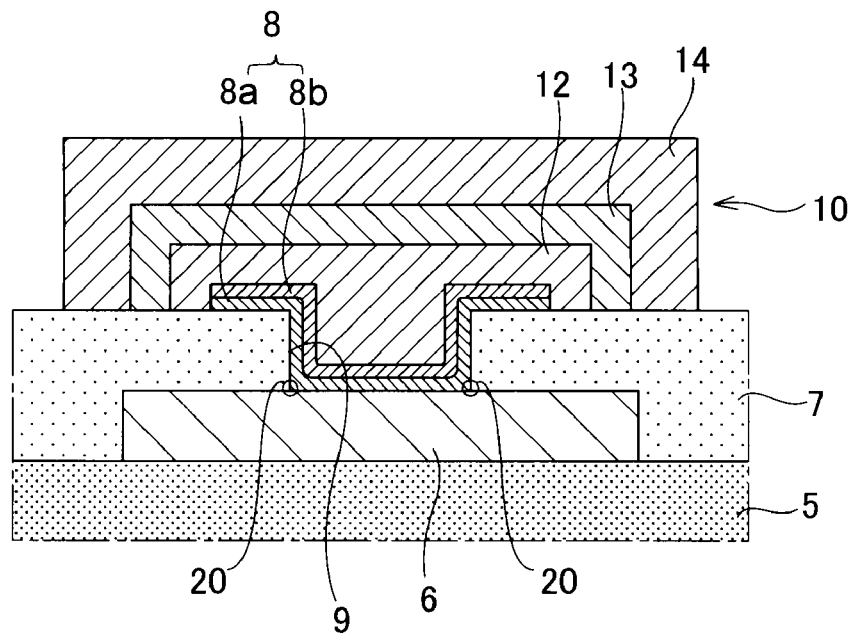
FIG. 5 is a cross-sectional view schematically showing substantial part of still another modified example of the electronic component according to the first embodiment.
Figure 6:
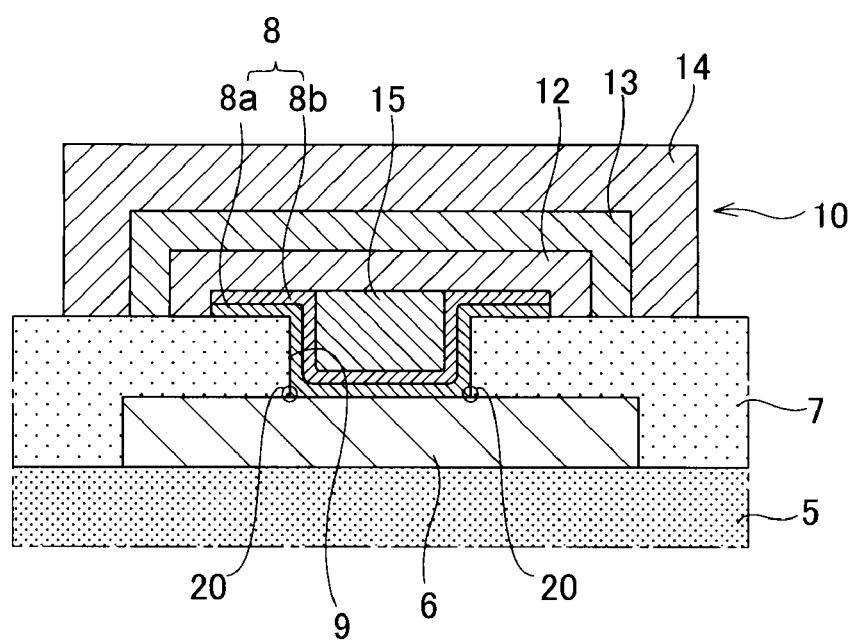
FIG. 6 is a cross-sectional view schematically showing substantial part of still another modified example of the electronic component according to the first embodiment.
Figure 7:
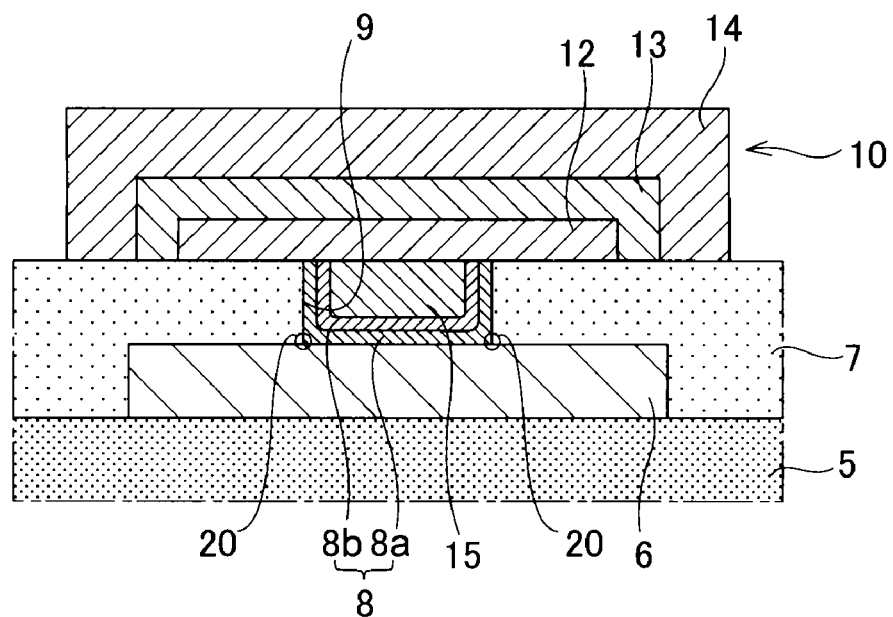
FIG. 7 is a cross-sectional view schematically showing substantial part of an electronic component according to a second embodiment of the present invention.
Figure 8:
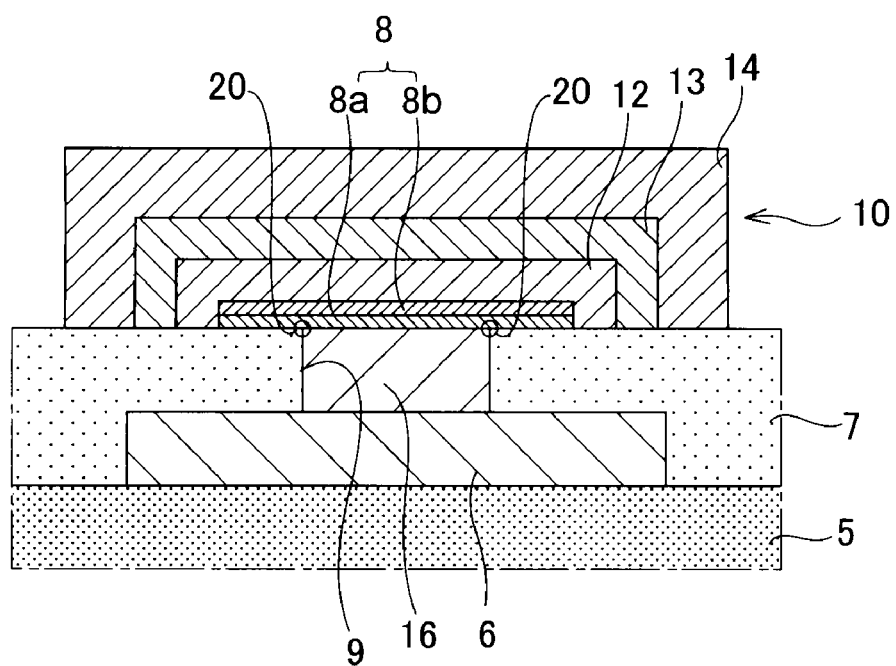
FIG. 8 is a cross-sectional view schematically showing substantial part of an electronic component according to a third embodiment of the present invention.

Further, FIG. 5 shows an enlarged cross-sectional view schematically showing substantial part (the connector between the surface conductor (the second conductor) and the internal conductor (the first conductor) corresponding to a section A in FIG. 4) of a modified example of the electronic component according to this embodiment (the following FIGS. 6 to 8 also show enlarged views of the connectors between the surface conductors (the second conductors) and the internal conductors (the first conductors) corresponding to the section A in FIG. 4 similarly to FIG. 5). As shown in FIG. 5, this modified example includes the upper conductor (the internal conductor being the first conductor) 6 located on the surface of the insulating film 5, the protective film 7 covering the surface of this upper conductor 6, the terminal electrode (the surface conductor being the second conductor) 10 formed on the surface of the protective film 7, and the via hole 9 penetrating the protective film 7 and reaching from the terminal electrode 10 to the upper conductor 6. However, the shield film 8 is formed of two layers of laminated films 8a and 8b. For example, these laminated films may be defined as a Cr film 8a and a Cu film 8b or a Ti film 8a and a Cu film 8b, which are sequentially laminated in each case.

Meanwhile, the terminal electrode 10 to be formed on the shielding film 8 may be defined as the set of the Cu film 12, the Ni film 13, and the Sn film (or an Au film) 14 which are sequentially laminated, for example. Depending on the size of the diameter of the via hole 9 or on the thickness dimension of the shielding film 8, there is a case where a dent is formed on the via hole 9 after forming the shielding film 8 as shown in FIG. 5, or a case where the via hole 9 is filled (buried) with the material constituting the shielding film 8 and no dent is formed thereon. When forming the terminal electrode 10, the terminal electrode 10 may be deposited by electrolytic plating, for example, when there is no dent. Alternatively, when there is a dent, the terminal electrode 10 may be formed by burying the dent with a conductive material by means of filled via plating, for example.

Moreover, when a dent is formed on the via hole 9 after formation of the shielding film 8 as described above, it is also possible to form a buried electrode 15 for burying the dent on the shielding film inside the dent as shown in FIG. 6. This buried electrode 15 can be formed: by precipitating Cu with electrolytic plating; or by filling conductive resin, for example. After providing the buried electrode 15 as described above, it is also possible to planarize an upper surface thereof by CMP (chemical mechanical polishing) or by buff polishing. In this way, it is possible to bond the shielding film 8 favorably to the terminal electrode 10 to be formed thereon.

In the example shown in FIG. 6, the shielding film 8 having conductivity is formed so as to cover the surface of the protective film 7 around the via hole, so that the electrical connection between the upper conductor (the first conductor) 6 and the terminal electrode (the second conductor) 10 is ensured by using this shielding film 8. Accordingly, it is also possible to bury the dent with a filler having no conductivity (or having low conductivity) instead of the buried electrode 15.

Second Embodiment

FIG. 7 is a cross-sectional view schematically showing substantial part of an electronic component according to a second embodiment of the present invention. As shown in the drawing, the electronic component of this embodiment includes the internal conductor (the first conductor) 6 covered with the protective film 7 serving as the insulator, the terminal electrode (the second conductor) 10 provided on the surface of the protective film 7, the via hole 9 formed so as to penetrate the protective film 7 in order to electrically connect this terminal electrode 10 to the internal conductor 6, and the shielding film 8 covering the interface 20 between the protective film 7 and the internal conductor 6 as similar to the first embodiment. However, the shielding film 8 of this embodiment is configured to cover the surface of the internal conductor 6 at the bottom surface of the via hole 9 and the inner wall surface of the via hole 9 only.

As similar to the first embodiment, the shielding film 8 may be formed by sequentially laminating two layers of the Cr film 8a and the Cu film 8b or the Ti film 8a and the Cu film 8b. Here, the shielding film 8 can be formed of a single film or a combination of three or more films (the same applies to other embodiments).

After formation of the shielding film 8, the buried electrode 15 similar to the one described in the modified example (FIG. 6) of the first embodiment is formed thereon. The shielding film 8 and the buried electrode 15 inside the via hole are planarized by polishing so as to be flush with the surface of the protective layer 7. Then, the terminal electrode 10 is formed thereon to electrically connect the internal conductor 6 to the terminal electrode 10 through the shielding film 8 and the buried electrode 15. Here, the buried electrode 15 can be formed similarly to the modified example (FIG. 6) of the first embodiment by means of Cu plating or filling of the conductive resin, for example. The planarization may be performed by the CMP or buff polishing. Moreover, the terminal electrode 10 can be formed by sequentially forming the Cu film 12, the Ni film 13, and the Sn film (or the Au film) 14, for example.

Third Embodiment

FIG. 8 is a cross-sectional view schematically showing substantial part of an electronic component according to a third embodiment of the present invention. As shown in the drawing, the electronic component of this embodiment includes the internal conductor (the first conductor) 6 covered with the protective film 7 serving as the insulator, the terminal electrode (the second conductor) 10 provided on the surface of the protective film 7, and the via hole 9 formed so as to penetrate the protective film 7 in order to electrically connect this terminal electrode 10 to the internal conductor 6 as similar to the first and second embodiments. However, the via hole 9 is formed as a filled via by filling the via hole with a conductor (a connecting conductor) 16, and the shielding film 8 is provided on a surface (a top surface) of this connecting conductor 16.

For example, the connecting conductor 16 may be formed by Cu plating, Cu filled via plating, or filling of the conductive resin as similar to formation of the buried electrode 15. The top surface thereof may be planarized by the CMP or buff polishing so as to be flush with the surface of the protective film 7. Thereafter, the shielding film 8 is formed on the connecting conductor 16 and on the protective film 7. Here, this shielding film 8 is formed so as to cover the entire top surface of the connecting conductor 16 and the surface of the protective layer 7 around the connecting conductor 16. In this way, it is possible to protect an interface between the connecting conductor 16 and the protective film 7. The shielding film 8 may be formed of a set of the Cr film (or the Ti film) 8a and the Cu film 8b to be deposited thereon.

After providing the shielding film 8, the terminal electrode 10 is formed so as to cover the shielding film 8. This terminal electrode 10 can be formed by sequentially laminating the Cu film 12, the Ni film 13, and the Sn film (or the Au film) 14, for example.

Although embodiments of the present invention have been described above, it is to be noted that the present invention is not limited only to the embodiments disclosed herein. It is obvious to those skilled in the art that various modifications are possible without departing from the scope of the invention as defined in the appended claims.

For example, various other modes of the materials, the numbers of laminated layers, and the methods of formation of the respective films on the base material including the respective film constituting the terminal electrode are applicable in addition to the configurations described above. Moreover, in addition to Cu, the internal conductors (the upper conductor (the first conductor) and the lower conductor) may apply other materials having low electric resistance such as Ag, Al or W. Further, the embodiment (FIG. 1) illustrates two conducting films as the internal conductors, the single insulating film, and the single dielectric film. However, any of these films may be provided in an arbitrary number equal to or more than one layer. When the chip does not include a capacitor as the functional element unit therein, it is not necessary to provide a dielectric layer.

Figure 9:
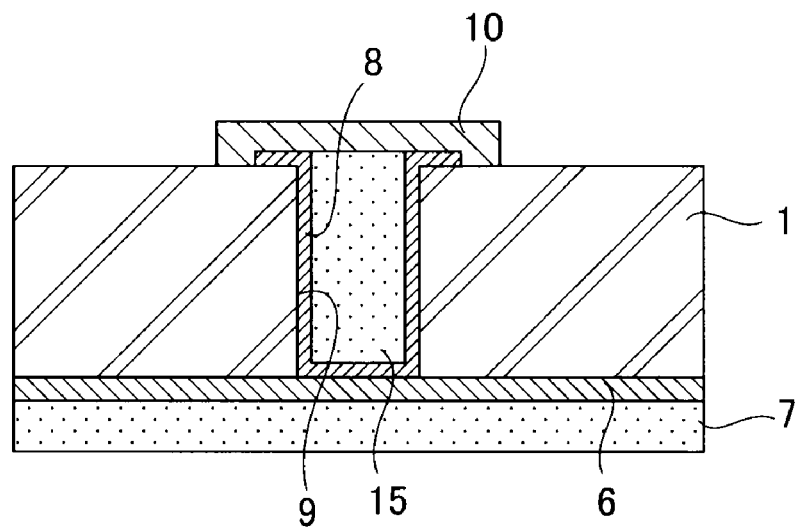
FIG. 9 is a cross-sectional view of a via hole of an electronic component showing an application example of the present invention.
Figure 10:
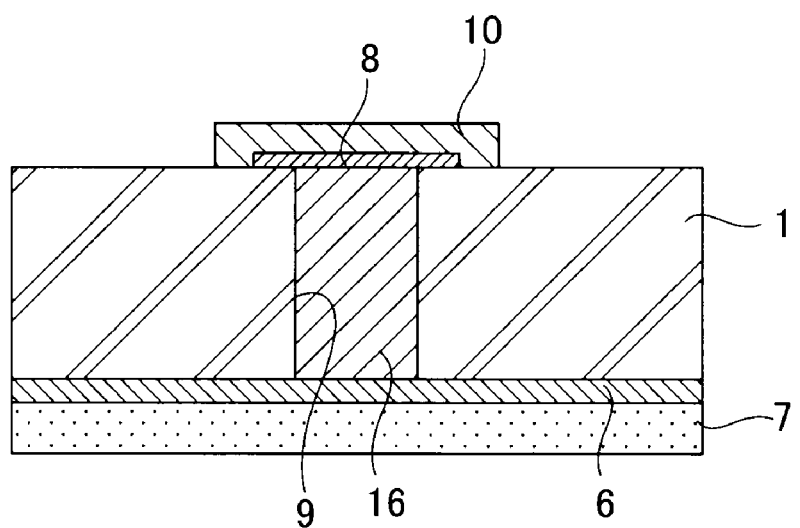
FIG. 10 is a cross-sectional view of a via hole of an electronic component showing another application example of the present invention.
Figure 11:
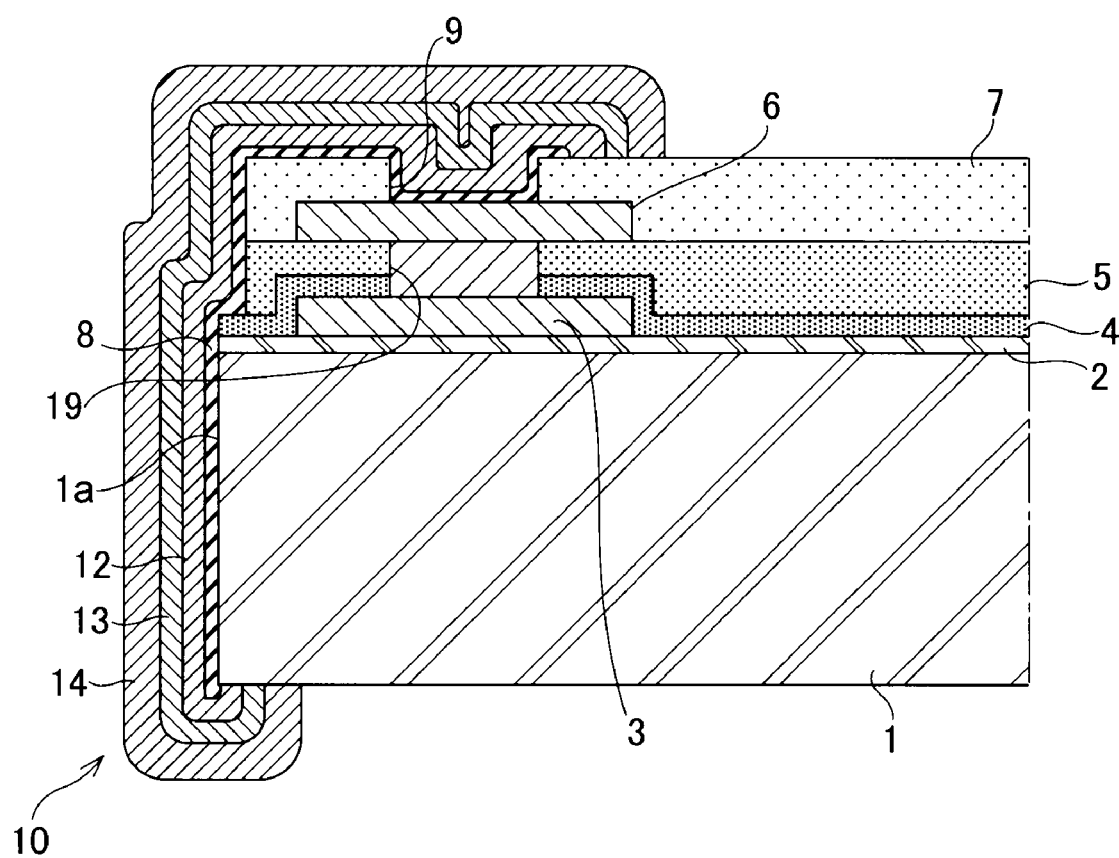
FIG. 11 is a cross-sectional view schematically showing still another modified example of the electronic component according to the first embodiment.

Moreover, according to the present invention, it is also possible to form both of the first conductor and the second conductor on the surfaces of the substrate. To be more precise, as shown in FIG. 9 and FIG. 10, it is also possible to form the shielding film 8 in a structure in which the first conductor 6 is located on one surface of the substrate 1 while the second conductor 10 to be electrically connected thereto is formed on the other surface of the substrate 1 so that the first conductor 6 is electrically connected to the second conductor 6 through the via hole 9 penetrating the substrate (the insulator) 1. Meanwhile, as shown in FIG. 11, it is also possible to form the shielding film 8 not only being on the via hole section but also extending to the side surface of the chip continuously, for example. In this configuration, it is also possible to use the shielding film 8 as a foundation electrode of the side surface terminal 10 (to form the respective layers constituting the terminal electrode on the shielding layer 8).

In the meantime, FIG. 1 and FIG. 11 describe a case of forming the conductive films, the insulating film, and the via holes provided with the shielding film only on the upper surface side of the base substrate 1. However, it is also possible to form one or more layers of any of the conductive films, the insulating films, and other films on the lower surface side of the base substrate and to connect the conductive films penetrating the insulating film. In this respect, it is possible to provide the shielding film configured to cover the interface between the conductor and the insulator by applying the present invention similarly to the configuration on the upper surface of the substrate. In this case, for example, it is also possible to use the respective structures shown in FIGS. 4 to 8 as a via hole structure to be provided on the lower surface side of the base substrate 1 (it is also possible to use the respective structures shown in FIGS. 4 to 8 for the via holes to be provided on the upper surface side of the substrate). Meanwhile, in the chip structure shown in FIG. 11, it is also possible to form the shielding film 8 continuously from the via hole on the upper side of the substrate to the side surface of the chip and further to the via hole on the lower surface side of the substrate.

What is claimed is:

1. An electronic component comprising:
    a first conductor made of a conductive material;
    an insulator made of an insulative material and configured to cover a surface of the first conductor;
    a via hole penetrating the insulator;
    a second conductor made of a conductive material and located on a surface of the insulator; and
    a connecting conductor located so as to be filled in the via hole and to electrically connect the first conductor to the second conductor; and
    a shielding film having conductivity, being interposed between the second conductor and the connecting conductor, and being configured to cover an interface between the connecting conductor and the insulator by extending from a surface of the connecting conductor to the surface of the insulator around the via hole,
    wherein the shielding film contains any of Cr, Ni, Ti, Cu, W, Ag and Al as a main component, and is formed of a film containing conductive particulates having grain diameters equal to or below 1.0 µm, and is a film having at least any of resistance to a surfactant treatment fluid inclusive of a degreasing fluid, resistance to an acidic chemical solution, resistance to an alkaline chemical solution, resistance to a solvent, resistance to alcohol, resistance to a plating fluid, resistance to an etching fluid, moisture resistance, gas permeation resistance, and corrosion resistance,
    wherein a top surface of the connecting conductor is planarized so as to be flush with a surface of the insulator.

2. The electronic component according to claim 1, wherein the second conductor is part of a side surface conductor provided on a side surface of the electronic component, the shielding film is formed to further cover the side surface of the electronic component, and the side surface conductor is formed on the shielding film.

3. The electronic component according to claim 1, wherein the second conductor is a terminal electrode provided on any of a top surface and a bottom surface of the electronic component.

4. The electronic component according to claim 1, wherein the shielding film is a film formed by a vapor growth method.

* * * * *